United States Patent
McDonald et al.

(10) Patent No.: US 6,769,319 B2
(45) Date of Patent: Aug. 3, 2004

(54) COMPONENT HAVING A FILTER

(75) Inventors: William G. McDonald, Scottsdale, AZ (US); David J. Monk, Mesa, AZ (US); James E. Hannibal, Jr., Phoenix, AZ (US); Slobodan Petrovic, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 103 days.

(21) Appl. No.: 09/901,366

(22) Filed: Jul. 9, 2001

(65) Prior Publication Data

US 2003/0005782 A1 Jan. 9, 2003

(51) Int. Cl.[7] ........................ G01D 11/24; G01L 19/14
(52) U.S. Cl. ...................................... 73/866.1; 73/431
(58) Field of Search ............................. 73/866.1, 706, 73/431, 432.1, 866.5; 29/595

(56) References Cited

U.S. PATENT DOCUMENTS

| | | | | |
|---|---|---|---|---|
| 2,951,371 A | * | 9/1960 | Reid | 73/431 |
| 3,334,204 A | * | 8/1967 | Brenny et al. | 200/82 R |
| 3,574,284 A | | 4/1971 | Thordarson | 73/715 |
| 3,619,742 A | | 11/1971 | Rud, Jr. et al. | 73/724 X |
| 3,718,566 A | * | 2/1973 | Krebs | 204/415 |
| 3,946,724 A | * | 3/1976 | La Balme | 75/706 |
| 4,034,609 A | | 7/1977 | Fuller | 73/335 |
| 4,177,496 A | | 12/1979 | Bell et al. | 73/724 X |
| 4,309,908 A | * | 1/1982 | Rapp et al. | 73/706 X |
| 4,571,244 A | | 2/1986 | Knighton | 604/118 |
| 4,686,764 A | | 8/1987 | Adams et al. | 73/706 X |
| 4,732,042 A | | 3/1988 | Adams | 73/706 |
| 4,734,674 A | | 3/1988 | Thomas et al. | |
| 4,802,952 A | | 2/1989 | Kobori et al. | 73/727 X |
| 4,909,070 A | | 3/1990 | Smith | 73/73 |
| 4,920,805 A | * | 5/1990 | Yajima et al. | 73/706 |

(List continued on next page.)

FOREIGN PATENT DOCUMENTS

| | | | |
|---|---|---|---|
| DE | 41 33 061 A1 | 4/1993 | |
| DE | 196 37 946 A1 | 3/1997 | |
| DE | 196 26 083 | 1/1998 | H01L/25/04 |
| EP | 0 677 726 | 10/1995 | G01C/9/06 |
| EP | 0 736 757 | 10/1996 | G01D/11/24 |
| EP | 0 762 096 | 3/1997 | G01L/9/00 |
| EP | 1 096 243 A2 | 5/2001 | |
| FR | 2 686 692 | 7/1993 | G01C/9/06 |
| FR | 2 787 194 | 6/2000 | |
| WO | WO 89/08244 | 9/1989 | 73/717 |
| WO | WO 96/03629 | 2/1996 | G01C/9/00 |
| WO | WO 00/35685 | 6/2000 | |

OTHER PUBLICATIONS

PCT/US02/18501 PCT Search Report mailed Sep. 25, 2002.
"Humidity Control Application" and "PTFE Breather Vent Filters Data Sheet", *Donaldson Filtration Solution*, having a publication date of at least prior to Dec. 21, 1999, pp. 7–8.

(List continued on next page.)

*Primary Examiner*—Thomas P. Noland

(57) ABSTRACT

A component includes a housing (110, 1110) at least partially defining a cavity (125, 1125), a sensor element (105) located in the cavity, and a support member (340, 1140) located over the cavity, located over at least a portion of the housing, and having a hole (341, 1141) over the cavity. The component also includes a filter (345, 700, 800, 1045) located over the support member and located over the hole in the support member.

30 Claims, 7 Drawing Sheets

U.S. PATENT DOCUMENTS

| | | | |
|---|---|---|---|
| 4,942,383 A | 7/1990 | Lam et al. | 73/719 X |
| 4,993,265 A | 2/1991 | Koen et al. | 73/700 |
| 5,207,102 A | 5/1993 | Takahashi et al. | 73/700 X |
| 5,308,939 A | 5/1994 | Sasaki | 73/723 X |
| 5,333,505 A | 8/1994 | Takahashi et al. | 73/727 |
| 5,436,491 A | 7/1995 | Hase et al. | 73/721 X |
| 5,583,370 A | 12/1996 | Higgins, III et al. | 257/667 |
| 5,600,071 A | 2/1997 | Sooriakumar et al. | |
| 5,612,576 A | 3/1997 | Wilson et al. | 257/788 |
| 5,625,151 A | 4/1997 | Yamaguchi | 73/716 |
| 5,700,981 A | 12/1997 | Tuttle et al. | 29/841 X |
| 5,785,791 A | 7/1998 | Letterman et al. | |
| 5,889,211 A | 3/1999 | Maudie et al. | |
| 5,894,167 A | 4/1999 | Moden et al. | 257/679 |
| 5,895,859 A | 4/1999 | Sawada et al. | 73/706 |
| 5,900,554 A | 5/1999 | Baba et al. | 73/725 |
| 5,914,033 A | 6/1999 | Carlsson | 73/706 X |
| 5,977,622 A | 11/1999 | Mertol | 257/687 |
| 5,981,314 A | 11/1999 | Genn et al. | 438/127 |
| 5,993,395 A * | 11/1999 | Shulze | 73/706 X |
| 6,067,709 A | 3/2000 | Godin et al. | 29/841 |
| 6,047,604 A | 4/2000 | Auburger et al. | 73/156 |
| 6,071,761 A | 6/2000 | Jacobs | 438/127 |
| 6,117,086 A * | 9/2000 | Shulze | 73/706 X |
| 6,191,359 B1 | 2/2001 | Sengupta et al. | 73/754 X |
| 6,222,372 B1 * | 4/2001 | Fukaya et al. | 324/464 |
| 6,401,545 B1 * | 6/2002 | Monk et al. | 73/706 X |
| 6,453,749 B1 * | 9/2002 | Petrovic et al. | 73/754 |

OTHER PUBLICATIONS

Adamson et al., "Dam and Fill Encapsulation for Microelectronic Packages," *Proceedings of the Nepcon West, National Electronic Packaging and Production Conference–Proceedings of the Technical Program (West and East)*, Feb. 1999, Anaheim, California, USA, pp. 1–2.

Mann, "A Computer–Aided, Spatially–Selective Protection Technique for Multichip Module and Chip–On–Board Devices," 0569–5503/92/0000–1046 *IEEE*, 1992, pp. 1046–1047.

Petrovic et al., "Reliability Test Methods for Media–Compatible Pressure Sensors," *IEEE Transactions on Industrial Electronics*, vol. 45, No. 6, Dec. 1998, p. 877.

Stuart, "Using Hydrophobic Membranes to Protect Gas Sensors," *The Journal of Applied Sensing Technology*, vol. 15, No. 5, May 1998?, 1 page.

* cited by examiner

COMPONENT HAVING A FILTER

CROSS REFERENCE TO RELATED APPLICATIONS

The present application is related to U.S. patent application Ser. No. 09/490927 entitled "Micro Electro-Mechanical System Sensor with Selective Encapsulation and Method Therefor," filed Jan. 25, 2000, and now U.S. Pat. No. 6,401,545 and U.S. patent application Ser. No. 09/429099 entitled Physical Sensor Component," filed Oct. 28, 1999, and now U.S. Pat. No. 6,453,749 both of which are assigned to the current assignee hereof.

FIELD OF THE INVENTION

This invention relates to filters, in general, and to components having filters and their methods of manufacture and operation, in particular.

BACKGROUND OF THE INVENTION

Physical sensor components such as, for example, pressure sensors can be used in automotive, industrial, consumer, and various other applications. Elastic gels, polymers, diaphragms, membranes, and other coatings or encapsulants have been used to protect the pressure sensors from the potentially corrosive environments in which the pressure sensors operate. However, none of these encapsulants are entirely impermeable to the corrosive environments. Furthermore, the encapsulants do not completely satisfy many stringent reliability requirements demanded by customers who use the pressure sensors.

A common failure mechanism for a silicon pressure sensor having a prior art coating or encapsulant occurs due to diffusion of the corrosive media through the encapsulant, which delaminates the encapsulant from the silicon pressure sensor. This delamination exposes portions of the silicon pressure sensor that subsequently corrode from the direct exposure to the corrosive media.

In addition to this common failure mechanism, most of the prior art coatings and encapsulants adversely affect the performance of the silicon pressure sensor. These adverse effects can include a pressure offset due to acceleration and/or a gel over-expansion due to a rapid change in pressure. Both of these adverse effects can severely limit the use of the silicon pressure sensor.

Accordingly, a need exists for an improved component that provides effective corrosion protection while not adversely affecting the performance of the component.

BRIEF DESCRIPTION OF THE DRAWINGS

The invention will be better understood from a reading of the following detailed description, taken in conjunction with the accompanying figures in the drawings in which.

Figure 1:
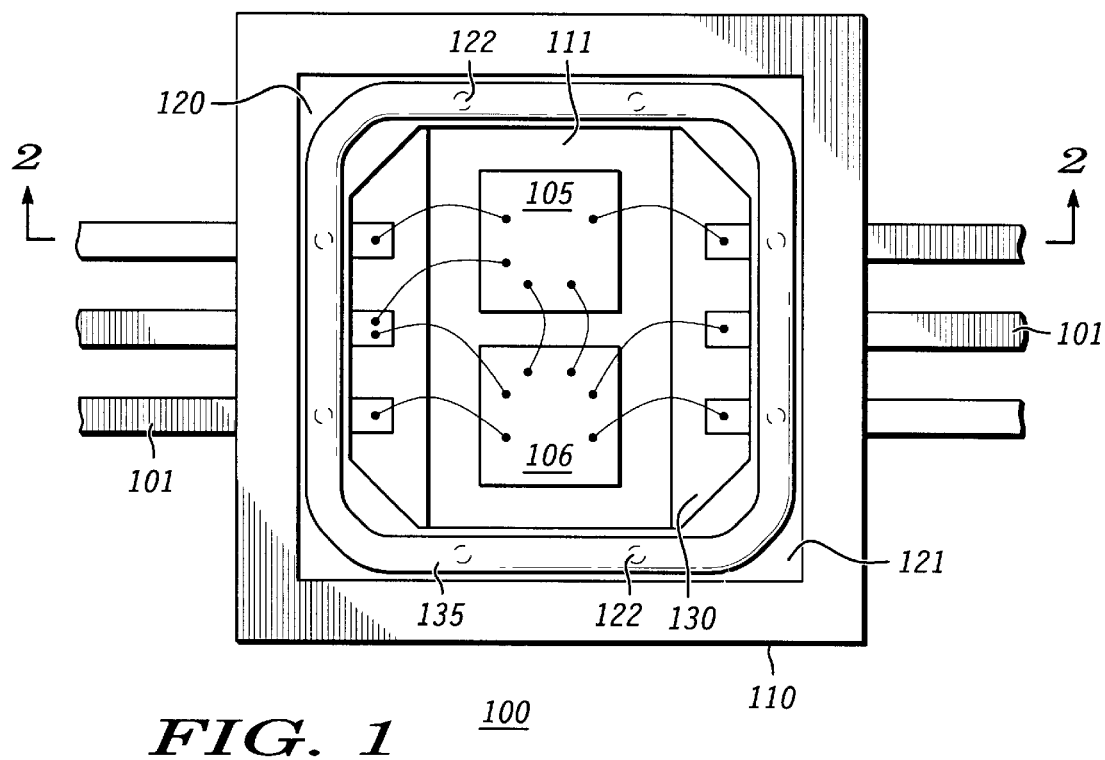
FIG. 1 illustrates a top view of a component in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale. For example, the dimensions of some of the elements in the figures may be exaggerated relative to other elements to help to improve understanding of embodiments of the present invention. Furthermore, the same reference numerals in different figures denote the same elements.

Furthermore, the terms first, second, third, and the like in the description and in the claims, if any, are used for distinguishing between similar elements and not necessarily for describing a sequential or chronological order. It is further understood that the terms so used are interchangeable under appropriate circumstances such that the embodiments of the invention described herein are, for example, capable of operation in other sequences than illustrated or otherwise described herein.

Moreover, the terms top, bottom, over, under, and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than illustrated or otherwise described herein.

DETAILED DESCRIPTION OF THE DRAWINGS

A component in accordance with the invention can comprise a sensor element and a filter that limits communication between the sensor element inside the component and a hostile environment outside the component. For instance, the filter can block potentially corrosive elements or media from the exterior environment while still permitting the unhindered transmission of pressure from the exterior environment to the sensor element inside the component. As an example, the component can be used in pressure sensing applications such as a tire pressure monitor. In this embodiment, the component can be wheel-mounted, rim-mounted, tire-valve mounted, or tire-mounted. Other examples of suitable applications for this component include gas, vapor, and other chemical monitors. Further examples of suitable applications for this component include medical and other biological monitors for pressure, liquid height, or flow rate measurements.

Figure 2:
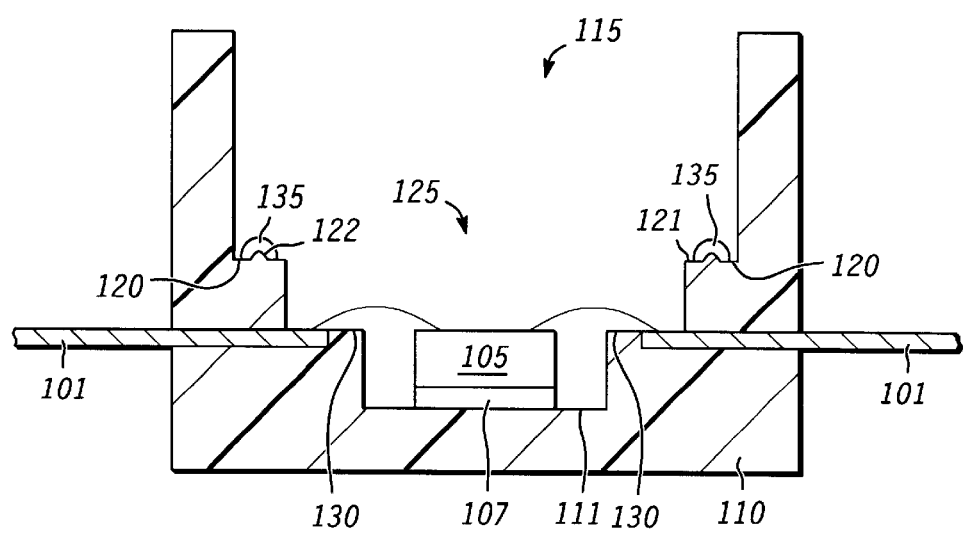
FIG. 2 illustrates a cross-sectional view of the component in FIG. 1 taken along a section line 2—2 in FIG. 1 in accordance with an embodiment of the invention.

FIG. 1 illustrates a top view of a component 100 having a cavity in communication with an environment outside component 100, and FIG. 2 illustrates a cross-sectional view of component 100 taken along a section line 2—2 in FIG. 1. Component 100 comprises a package, chip carrier, or housing 110. As an example, housing 110 has a recess 115 and a cavity 125 located within recess 115. Housing 110 at least partially defines a lower portion of recess 115 and cavity 125. Housing 110 can include inserts or the like to define the actual boundaries of recess 115 and/or cavity 125.

Housing 110 can also have a shelf or rim 120 located at a perimeter of recess 115. As explained in more detail hereinafter, rim 120 can be used to support two support members and a filter over cavity 125. Rim 120 is preferably continuous around the perimeter of recess 115 and can be located at an edge of cavity 125 or above cavity 125. Rim 120 comprises a surface 121 and can comprise a plurality of optional protrusions 122 extending from surface 121. In the embodiment illustrated in FIG. 2, surface 121 faces away from cavity 125, and protrusions 122 extend away from cavity 125. After understanding the embodiment illustrated in FIG. 2, other embodiments of surface 121 and protrusions 122 will be obvious to those skilled in the art. Examples of other embodiments include, but are not limited to, different numbers of protrusions and different angles for the surface and for the protrusions.

Housing 110 can further comprise an additional rim 130 located at a perimeter of cavity 125. Rim 130 is located below rim 120 within recess 115. As explained in more detailed hereinafter, rim 130 can be used to support electrical leads.

Housing 110 can still further comprise a mounting surface 111 located in cavity 125. Mounting surface 111 is located below rim 130. As explained in more detailed hereinafter, mounting surface 111 can be used to support a sensor element and an electronic element.

Housing 110 is preferably comprised of a substantially rigid material that is resistant to corrosion by the corrosive elements or media in the environment in which component 100 is used. As an example, housing 110 can be comprised of a PolyPhenyleneSulfide (PPS) material.

Component 100 also comprises a sensor element 105. Sensor element 105 senses a characteristic of the environment outside of component 100 in which component 100 is used. As an example, the characteristic can be a pressure of the exterior environment. Sensor element 105 is located in cavity 125 of housing 110 and can be supported by mounting surface 111 of housing 110.

Component 100 can further comprise an optional electronic element 106. Electronic element 106 can be used to control sensor element 105. In addition or in the alternative, electronic element 106 can monitor and/or store an output of sensor element 105. Accordingly, electronic element 106 can be a semiconductor element such as, for example, a single transistor or an integrated circuit. In one embodiment of component 100, electronic element 106 is not present in component 100.

Electronic element 106 is located in cavity 125 of housing 110 and can be supported by mounting surface 111 of housing 110. Electronic element 106 is located adjacent to sensor element 105 and can be electrically coupled to sensor element 105. When component 100 includes electronic element 106, component 100 can be referred to as a module.

Component 100 can further comprise an adhesive 107. Adhesive 107 couples sensor element 105 to mounting surface 111 of housing 110. A different portion of adhesive 107 can also be used to couple electronic element 106 to mounting surface 111 of housing 110.

Component 100 can still further comprise electrical leads 101. A first portion of electrical leads 101 can protrude outside of housing 110. A second portion of electrical leads 101 can extend through housing 110. A third portion of electrical leads 101 can be located in cavity 125 and are supported by rim 130. The third portion of electrical leads 101 can be located below rim 120 and above mounting surface 111, and the third portion of electrical leads 101 can be electrically coupled to sensor element 105 and electronic element 106. The electrical coupling schemes between sensor element 105 and electrical leads 101, between electronic element 106 and electrical leads 101, and between sensor element 105 and electronic element 106 can be identical or different from each other and can include, for example, wire bonding, tape bonding, and/or flip chip bonding.

Component 100 can additionally comprise a sealant or adhesive 135. Preferably, adhesive 135 forms a continuous bead over rim 120 and around the perimeter of recess 115. Also in the preferred embodiment, adhesive 135 is a perfluoroether or other suitable material that is resistant to corrosion by the corrosive elements in the environment in which component 100 is used. Examples of suitable perfluoroether materials include Sifel 603 and 604, which are commercially available from Shin-Etsu Silicones of America, Inc. of Akron, Ohio, and RTV 8012, which is commercially available from Dow Corning Corporation of Auburn, Mich. Sifel 603 and 604 are preferred over RTV 8012 because of their lower viscosity.

Figure 3:
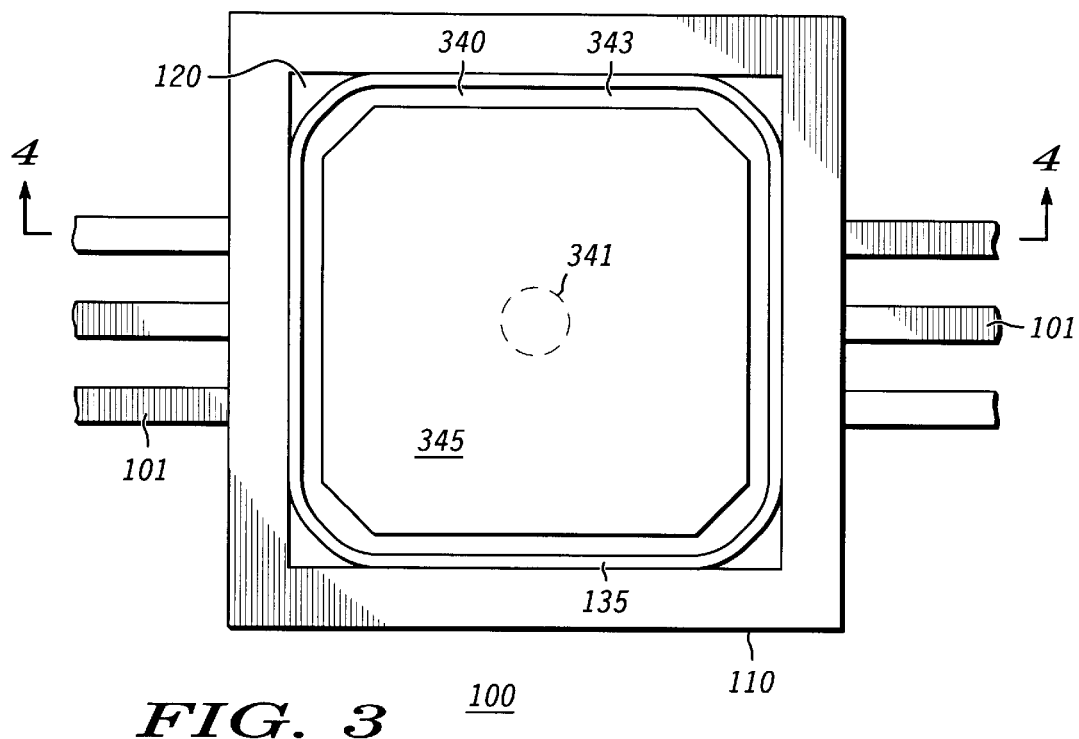
FIG. 3 illustrates a top view of the component in FIG. 1 after additional manufacturing steps in accordance with an embodiment of the invention.
Figure 4:
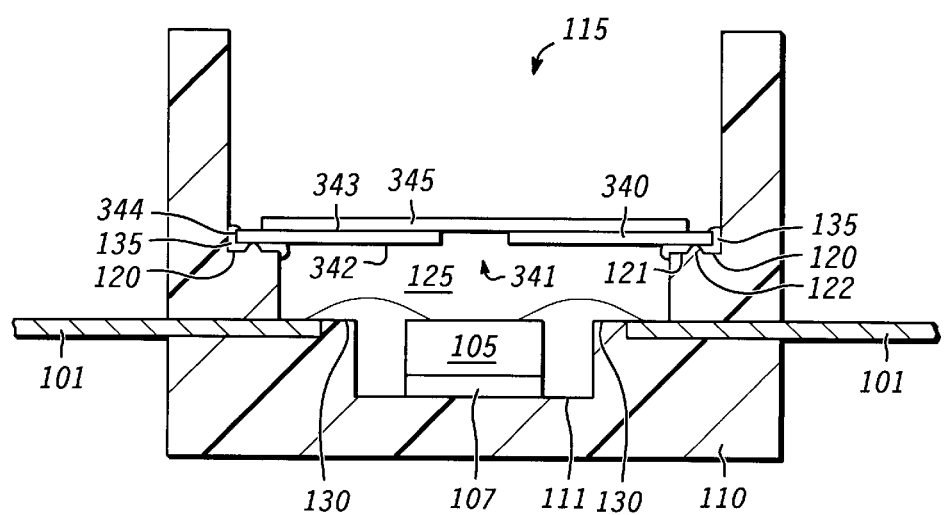
FIG. 4 illustrates a cross-sectional view of the component in FIG. 3 taken along a section line 4—4 in FIG. 3 in accordance with an embodiment of the invention.

FIG. 3 illustrates a top view of component 100 after additional manufacturing steps, and FIG. 4 illustrates a cross-sectional view of component 100 taken along a section line 4—4 in FIG. 3. As illustrated in FIGS. 3 and 4, component 100 comprises a support member 340. As explained in more detailed hereinafter, support member 340 can improve the mechanical support, stability, and reliability for a filter in component 100.

Support member 340 is located over at least a portion of housing 110 and over cavity 125. Support member 340 is also located within recess 115 of housing 110. For reasons explained hereinafter, the length and width of support member 340 is preferably slightly smaller than the length and width of recess 115.

Support member 340 can have sides 342 and 343 and an edge 344 coupling together sides 342 and 343. Side 342 faces towards cavity 125, and side 343 faces away from cavity 125. Side 342 of support member 340 preferably at least partially defines an upper portion or boundary of cavity 125. Rim 120 supports support member 340 over cavity 125. When rim 120 comprises protrusions 122, protrusions 122 of rim 120 support side 342 of support member 340 over surface 121 of rim 120 and over cavity 125.

Support member 340 has a hole 341 over cavity 125 to permit communication between sensor element 105 and the environment outside component 100. As an example, hole 341 can be circular and can have a diameter of approximately 0.05–0.15 centimeters. Also as an example, support member 340 can have a thickness of approximately 0.02–0.03 centimeters and a length and a width of approximately 0.4–0.6 centimeters each. One skilled in the art will understand that hole 341 can have other sizes and/or geometries.

Support member 340 is preferably comprised of a substantially rigid material that is resistant to corrosion by the environment in which component 100 operates. As an example, the material can be plastic or metal. A suitable plastic can be the same or different from the plastic used for housing 110, and an example of a suitable metal is stainless steel.

Support member 340 is preferably chemically coupled or otherwise adhered to rim 120 of housing 110 by adhesive 135. Accordingly, adhesive 135 is located at least between surface 121 of rim 120 and side 342 of support member 340 to adhere a perimeter of surface 121 to side 342. This portion of adhesive 135 preferably has a thickness of approximately 0.005 to 0.015 centimeters to provide a continuous seal between housing 110 and support member 340. The preferred embodiment of a continuous bead for adhesive 135 also ensures the formation of the continuous seal at the perimeter of support member 340. Protrusions 122 can be used to ensure such a thickness for this portion of adhesive 135.

Support member 340 is also preferably chemically coupled or otherwise adhered to the vertical sidewalls of housing 110. Accordingly, adhesive 135 is also preferably located between edge 344 of support member 340 and the vertical sidewalls of housing 110 to adhere edge 344 to housing 110. Further in the preferred embodiment, edge 344 has a height, and adhesive 135 has a height at least as high as the height of edge 344. The height of edge 344 and the height of adhesive 135 are both measured upwards from surface 121 of rim 120 and away from cavity 125. This side portion of adhesive 135 further ensures the formation of the continuous seal at the perimeter of support member 340. Additional protrusions can be added to the vertical sidewalls of housing 110 to ensure a desired thickness for this side portion of adhesive 135.

Therefore, the location of adhesive 135 is both vertically adjacent and laterally adjacent to support member 340 to provide a more reliable continuous seal between support member 340 and housing 110. The continuous seal prevents liquids, gasses, and other contaminants in the environment outside of component 100 from entering component 100 into cavity 125 by a path other than through hole 341 in support member 340.

Component 100 in FIGS. 3 and 4 also comprise a filter 345. Filter 345 limits communication between sensor element 105 inside cavity 125 of component 100 and a hostile environment outside component 100. As an example, filter 345 can block potentially corrosive elements or media from the outside environment while still permitting the unhindered transmission of pressure from the outside environment through filter 345 to sensor element 105 inside component 100. In the preferred embodiment, filter 345 is a composite filter comprised of a plurality of layers. These layers are described in more detail hereinafter.

Filter 345 is located over support member 340. In particular, filter 345 is located over side 343 of support member 340. Side 343 of support member 340 can support filter 345 over cavity 125 of housing 110. Filter 345 is preferably chemically coupled or otherwise adhered to support member 340. To facilitate the assembly of filter 345 to support member 340, filter 345 is preferably slightly smaller than support member 340 by approximately 0.4–0.6 millimeters per side. Filter 345 is also located over hole 341 in support member 340. Filter 345 is further located over at least a portion of housing 110 and within recess 115 of housing 110.

Filter 345 is thin and can be flimsy. Therefore, support member 340 can be used to improve the mechanical support, stability, and reliability of filter 345. In particular, support member 340 provides improved mechanical support, stability, and reliability for filter 345 when the pressure in the environment external to component 100 suddenly increases.

Figure 5:
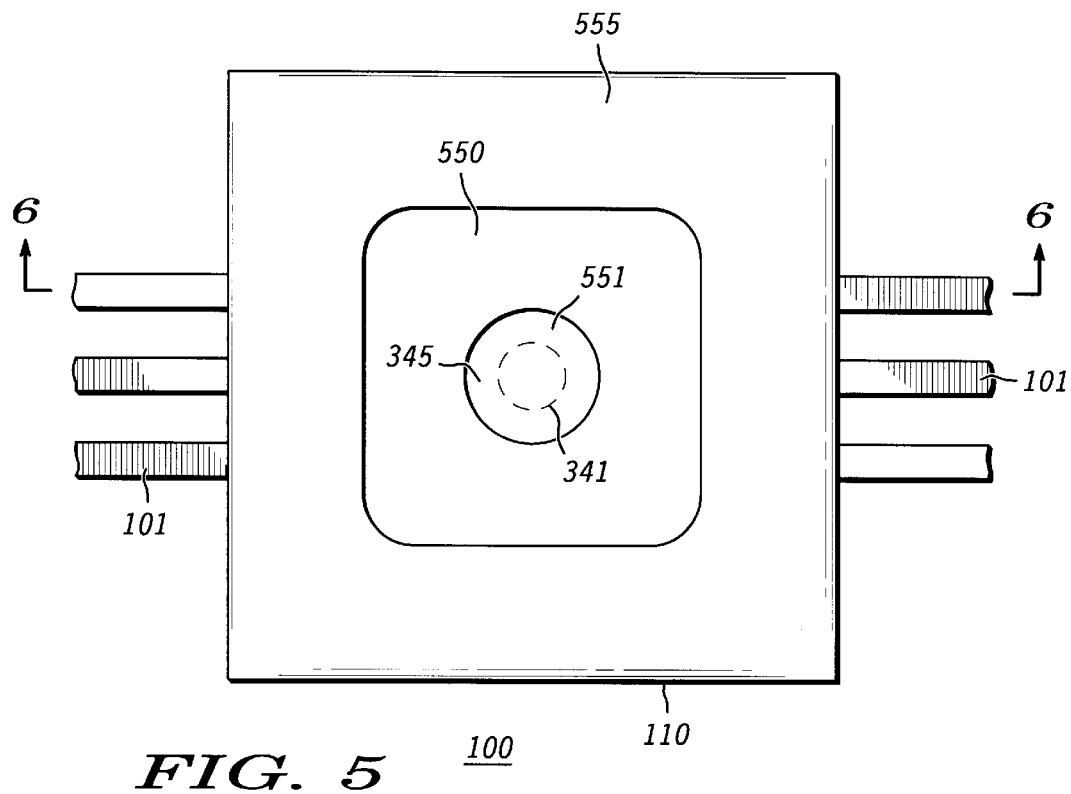
FIG. 5 illustrates a top view of the component in FIG. 3 after further manufacturing steps in accordance with an embodiment of the invention.
Figure 6:
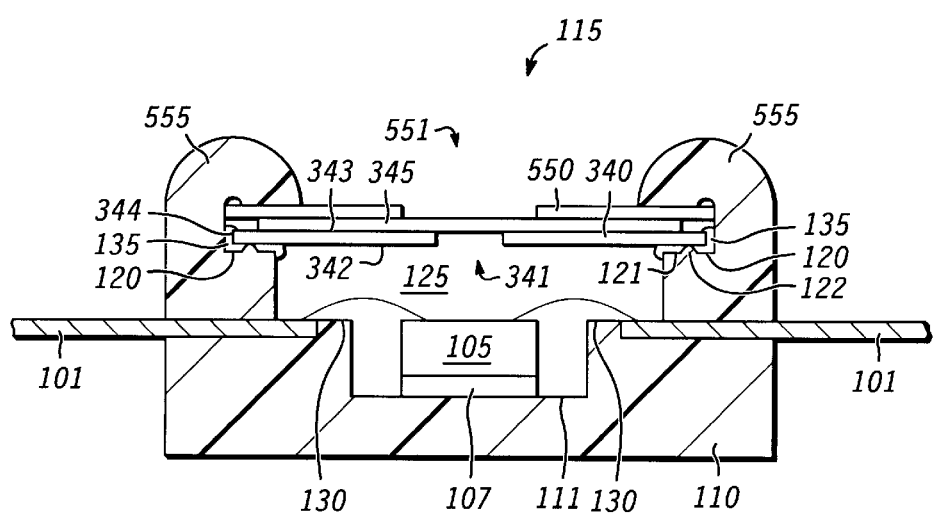
FIG. 6 illustrates a cross-sectional view of the component in FIG. 5 taken along a section line 6—6 in FIG. 5 in accordance with an embodiment of the invention.

FIG. 5 illustrates a top view of component 100 after further manufacturing steps, and FIG. 6 illustrates a cross-sectional view of component 100 taken along a section line 6—6 in FIG. 5. As illustrated in FIGS. 5 and 6, component 100 can comprise an additional or second support member 550. As explained in more detailed hereinafter, support member 550 can further improve the mechanical support, stability, and reliability of filter 345 in component 100. In a different embodiment of component 100, support member 550 is not used in component 100.

Support member 550 is located over at least a portion of housing 110, over cavity 125, and over filter 345. Support member 550 is preferably supported over cavity 125 by filter 345. Support member 550 is also located within recess 115 of housing 110.

Support member 550 has a hole 551 over filter 345, over hole 341 in support member 340, and over cavity 125 to permit communication between sensor element 105 and the environment outside component 100. As an example, hole 551 can be circular and can have a diameter larger than the diameter of hole 341 in support member 550. As an example, the diameter of hole 551 can be approximately 0.3–0.5 centimeters. This size of hole 551 optimizes two design parameters: the mechanical protection for filter 345 and the reduced clogging of hole 551 by particulates in the environment in which component 100 operates. One skilled in the art will understand that hole 551 can have other sizes and/or geometries.

Support member 550 is preferably comprised of a substantially rigid material that is resistant to corrosion by the environment in which component 100 operates. As an example, the material can be plastic or metal. A suitable plastic can be the same or different from the plastic used for housing 110, and an example of a suitable metal is stainless steel. In the preferred embodiment, support member 550 is comprised of the same material as support member 340. Also as an example, support member 550 can have a thickness of approximately 0.02–0.03 centimeters and a length and a width of approximately 0.4–0.6 centimeters each. In the preferred embodiment, support member 550 is slightly larger than support member 340.

Support member 550 is preferably mechanically coupled to housing 110 by swaging an upper rim or portion 555 of the walls of housing 110 defining recess 115. In this embodiment, as illustrated in FIG. 6, rim or portion 555 of housing 110 is located over support member 550. In a different embodiment, support member 550 can also be chemically coupled or otherwise adhered to housing 110 by an adhesive.

As indicated earlier, filter 345 is thin and can be flimsy. Therefore, support member 550 is used to further improve the mechanical support, reliability, and stability for filter 345. In particular, support member 550 can provide improved mechanical support, reliability, and stability for filter 345 when the pressure in the environment external to component 100 suddenly decreases.

Accordingly, cavity 125 of component 100 is in limited communication with the environment outside of recess 115 through hole 341 of support member 340, filter 345, and hole 551 of support member 550. Filter 345 isolates or otherwise protects metallic or other portions of sensor element 105 and electronic element 106 in cavity 125 from corrosive elements or media of the environment in which component 100 operates. Empirical test results have demonstrated the effectiveness of component 100 for protecting a sensor element from corrosion in various potentially corrosive environments such as, for example, tire mounting paste, tire mounting and general purpose lubricants, tire de-mounting fluid, brake fluid, degreaser, wheel cleaner, and mineral oil.

Figure 7:
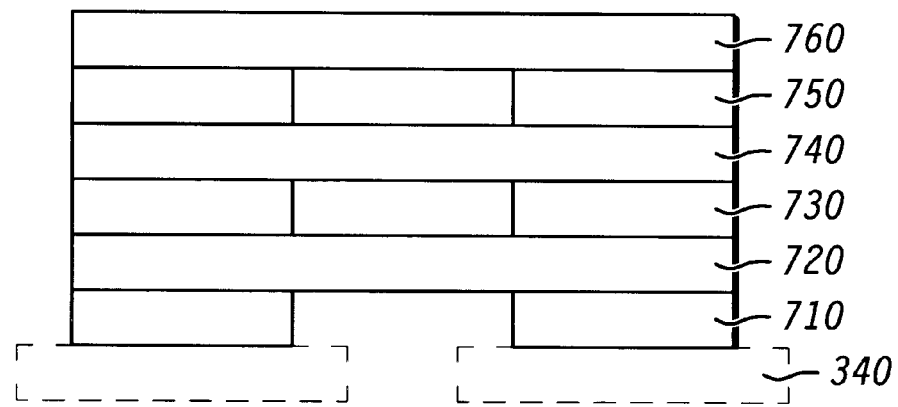
FIG. 7 illustrates a cross-sectional view of a filter in accordance with an embodiment of the invention.

FIG. 7 illustrates a cross-sectional view of a filter 700. As an example, filter 700 can be a more detailed view of filter 345 in FIGS. 4 and 6. Support member 340 of FIGS. 4 and 6 is shown in FIG. 7 in dashed lines to illustrate how filter 700 can be used in component 100 of FIGS. 4 and 6.

Filter 700 comprises adhesives 710, 730, and 750 and also comprises layers 720, 740, and 760. As an example, layers 720, 740, and 760 can be comprised of a polyester material, a nylon material, and a PolyTetraFluoroEthylene (PTFE) material, respectively. Filter 700 is commercially available from the Donaldson Company, Inc. of Minneapolis, Minn. and can also be purchased from Pall Specialty Materials of Port Washington, N.Y.

In one embodiment of filter 700, the polyester material of layer 720 and/or the nylon material of layer 740 can provide some filtering characteristics for filter 700. For example, the polyester and/or nylon materials can be treated with one or more chemicals to be hydrophobic and/or oleophobic. When filter 700 is to be used in an environment having high temperatures, layer 740 can be comprised of, for example, a non-woven nylon material and can be adhered to layers 720 and/or 760 using an adhesive lamination. When filter 700 is to be used only in an environment having lower temperatures, layer 720 can be adhered to support member 340 and/or layer 740 using a thermal pressure lamination.

The PTFE material of layer 760 is porous to provide at least some of the filtering characteristics for filter 700. The porous nature of PTFE material can be provided by holes in the PTFE material that are smaller than 1 micrometer in diameter. As an example, the holes can be approximately 0.05–0.1 micrometers in diameter. Other specifications for the PTFE material can include the following: (1) a silicone-free PTFE material, (2) a thickness of approximately 0.01–0.1 centimeters at approximately 3.4 kiloPascals, (3) a Mullen hydrostatic/water intrusion pressure (American Society for Testing and Materials (ASTM) D751) of approximately 850–950 kilopascals, (4) an oil repellency index of approximately 7 according to the American Association of Textile Chemists/Colorists (AATCC) 118-1992 standard test method, (5) a Frazier permeability (ASTM D737) of approximately 3350–3450 liters per hour at approximately 12.7 millimeters of water, (6) a Fomblin efficiency of approximately 99.9–99.999 percent minimum on approximately 0.1 micrometers at $1.8 \times 10^4$ liters per hour, (7) an IsoPropyl Alcohol (IPA) bubble point of approximately 250–300 kiloPascals at approximately 10.0 milliliters per minute, and (8) a Moisture Vapor Transmission Rate (MVTR) of approximately 800–850 grams per meter-squared hour.

As an example, the PTFE material can be a Teflon® material, which is commercially available from E. I. du Pont de Nemours and Company of Wilmington, Del., or a Gore-Tex® material, which is commercially available from W. L. Gore & Associates of Newark, Del. If a Teflon® material is used for layer 760, layer 760 can also be hydrophobic and can control the humidity level within cavity 125 of component 100 in FIG. 6.

Figure 8:
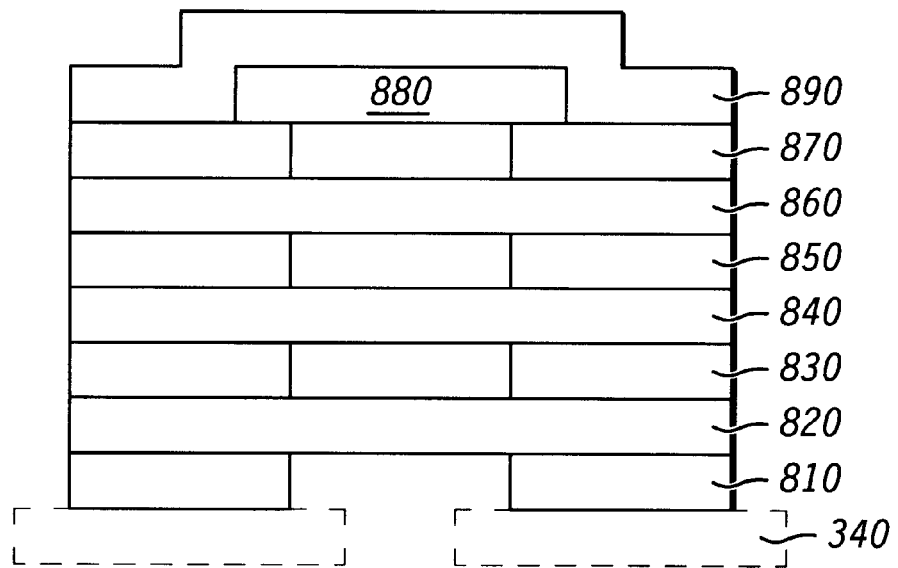
FIG. 8 illustrates a cross-sectional view of another filter in accordance with an embodiment of the invention.

FIG. 8 illustrates a cross-sectional view of a filter 800. As an example, filter 800 can be a more detailed view of filter 345 in FIGS. 4 and 6. Support member 340 of FIGS. 4 and 6 is shown in FIG. 8 in dashed lines to illustrate how filter 800 can be used in component 100 of FIGS. 4 and 6.

Filter 800 comprises adhesives 810, 830, 850, and 870 and also comprises layers 820, 840, 860, 880, and 890. As an example, layers 820, 840, and 860 can be comprised of a polyester material, a PolyTetraFluoroEthylene (PTFE) material, and a nylon material, respectively. Layers 820, 840, and 860 in FIG. 8 can be similar to layers 720, 760, and 740, respectively, in FIG. 7. Layers 880 and 890 in FIG. 8 can be, for example, an activated carbon material and an outer scrim, respectively. Filter 800 is commercial available from the Donaldson Company, Inc. of Minneapolis, Minn. and can also be purchased from Pall Specialty Materials of Port Washington, N.Y.

Figure 9:
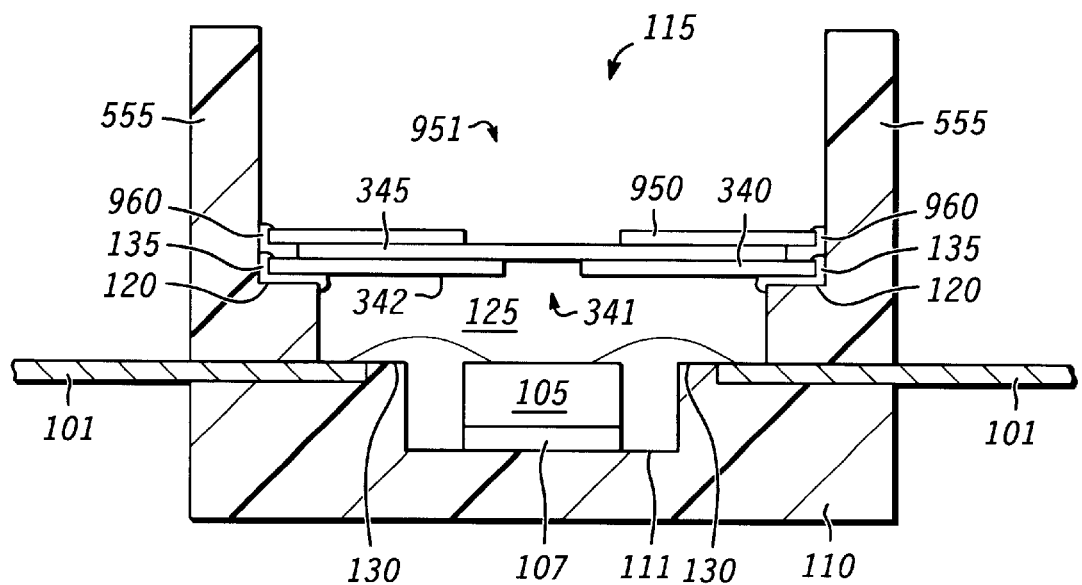
FIG. 9 illustrates a cross-sectional view of another component in accordance with an embodiment of the invention.

FIG. 9 illustrates a cross-sectional view of a component 900, which can be a different embodiment of component 100 in FIG. 6. Component 900 in FIG. 9 comprises an additional or second support member 950. Similar to support member 550 in FIG. 6, support member 950 in FIG. 9 can further improve the mechanical support, stability, and reliability of filter 345.

Support member 950 is located over at least a portion of housing 110, over cavity 125, and over filter 345. Support member 950 is preferably supported over cavity 125 by filter 345. Support member 950 is also located within recess 115 of housing 110. In FIG. 9, housing 110 is illustrated without the optional protrusions that are illustrated to extend from surface 121 of rim 120 in FIG. 6.

Support member 950 has a hole 951 over filter 345, over hole 341 in support member 340, and over cavity 125 to permit communication between sensor element 105 and the environment outside component 900. Support member 950 and hole 951 in FIG. 9 can be similar to support member 550 and hole 551 in FIG. 6. Support member 950, however, is preferably chemically coupled or otherwise adhered to housing 110 by an adhesive 960. In one embodiment, adhesive 960 can be similar to adhesive 135. In this embodiment, adhesives 135 and 960 can be considered one adhesive that has a height from rim 120 that is at least as high as the top surface of support member 950. In a different embodiment, support member 950 can also be mechanically coupled to housing 110 by swaging portion 555 of the walls defining recess 115.

Support member 950 can be approximately the same size as support member 340 to permit adhesive 135 to be located between an edge of support member 950 and the vertical sidewall of housing 110. In this embodiment, adhesive 135 can further improve the reliability of the continuous seal at the perimeter of recess 115.

Figure 10:
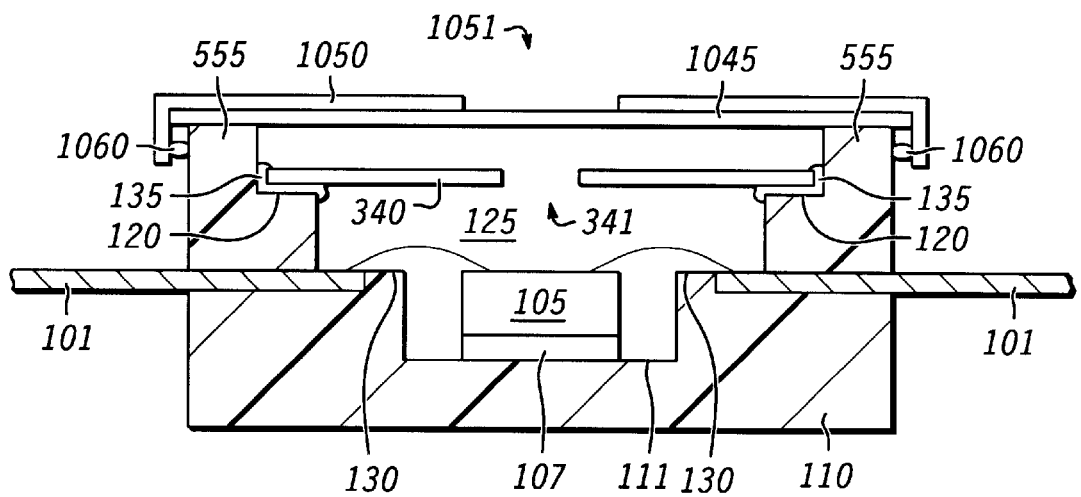
FIG. 10 illustrates a cross-sectional view of still another component in accordance with an embodiment of the invention.

FIG. 10 illustrates a cross-sectional view of a component 1000, which can be a different embodiment of component 100 in FIG. 6. Component 1000 in FIG. 10 comprises a filter 1045. Filter 1045 in FIG. 10 can be similar in function and material composition as filter 345 in FIG. 6. Filter 1045 is located over support member 340. Filter 1045 is also located over hole 341 in support member 340 and is further located over at least a portion of housing 110. In FIG. 10, housing 110 is illustrated without the optional protrusions that are illustrated to extend from surface 121 of rim 120 in FIG. 6.

Filter 1045 is preferably located outside of housing 110 and is supported over cavity 125 by rim or portion 555 of housing 110. In a different embodiment of component 1000, support member 340 can support filter 1045 over cavity 125 of housing 110. In this embodiment, housing 110 can still have rim 120, but housing can be shorter in height. In this different embodiment of housing 110, filter 1045 can also be chemically coupled or otherwise adhered to support member 340.

As illustrated in FIG. 10, component 1000 also comprises an additional or second support member 1050. Similar to support member 550 in FIG. 6, support member 1050 in FIG. 10 can further improve the mechanical support, stability, and reliability of filter 1045 in component 1000. Support member 1050 in FIG. 10, however, is a skirt or flange.

Support member 1050 is located over at least a portion of housing 110, over cavity 125, and over filter 1045. Support member 1050 is preferably supported over cavity 125 by filter 1045. Support member 1050 is also preferably located outside of housing 110. Support member 1050 has a hole 1051 over filter 1045, over hole 341 in support member 340, and over cavity 125 to permit communication between sensor element 105 and the environment outside component 1000. Support member 1050 in FIG. 10 can be similar in material composition to support member 550 in FIG. 6, and hole 1051 in FIG. 10 can be similar to the size of hole 551 in FIG. 6. Support member 1050, however, is preferably chemically coupled or otherwise adhered to housing 110 by an adhesive 1060 located outside of housing 110. In one embodiment, adhesive 1060 can be similar to adhesive 135.

Figure 11:
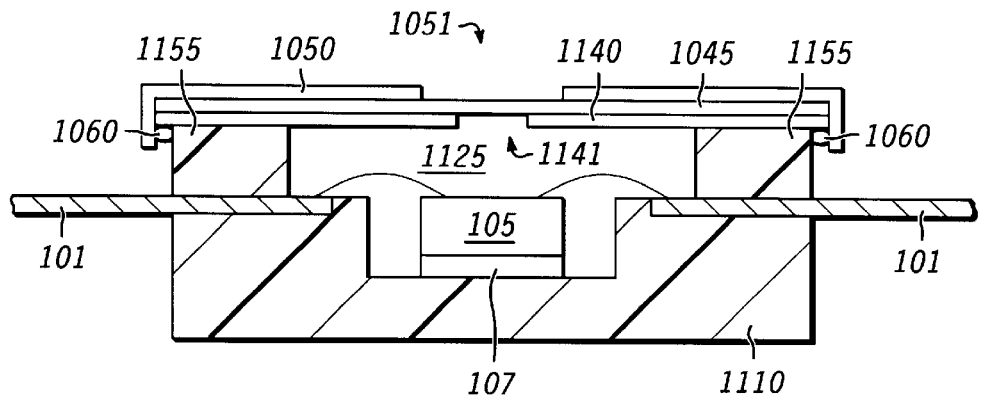
FIG. 11 illustrates a cross-sectional view of yet another component in accordance with an embodiment of the invention.

FIG. 11 illustrates a cross-sectional view of a component 1100, which can be a different embodiment of component 1000 in FIG. 10. Component 1100 in FIG. 11 comprises a housing 1110. Housing 1110 in FIG. 11 can be similar to housing 110 in FIG. 6. For example, housing 1110 in FIG. 11 has a cavity 1125 similar to cavity 125 of housing 110 in FIG. 6, but housing 1110 in FIG. 11 does not have an upper rim inside a recess of housing 1110.

Component 1100 also comprises a support member 1140. Support member 1140 is located over at least a portion of housing 110 and over cavity 125. Support member 1140 is preferably located outside of housing 110 and is supported over cavity 125 by a rim or portion 1155 of housing 110. Support member 1140 has a hole 1141 over cavity 125 to permit communication between sensor element 105 and the environment outside component 1100. Support member 1140 in FIG. 11 can be similar to support member 340 in FIG. 6, and hole 1141 in FIG. 11 can be similar to hole 341 in FIG. 6. Support member 1140 can be chemically coupled or otherwise adhered to housing 110, and/or support member 1140 can be coupled to housing 110 by filter 1045, support member 1050, and adhesive 1060.

Figure 12:
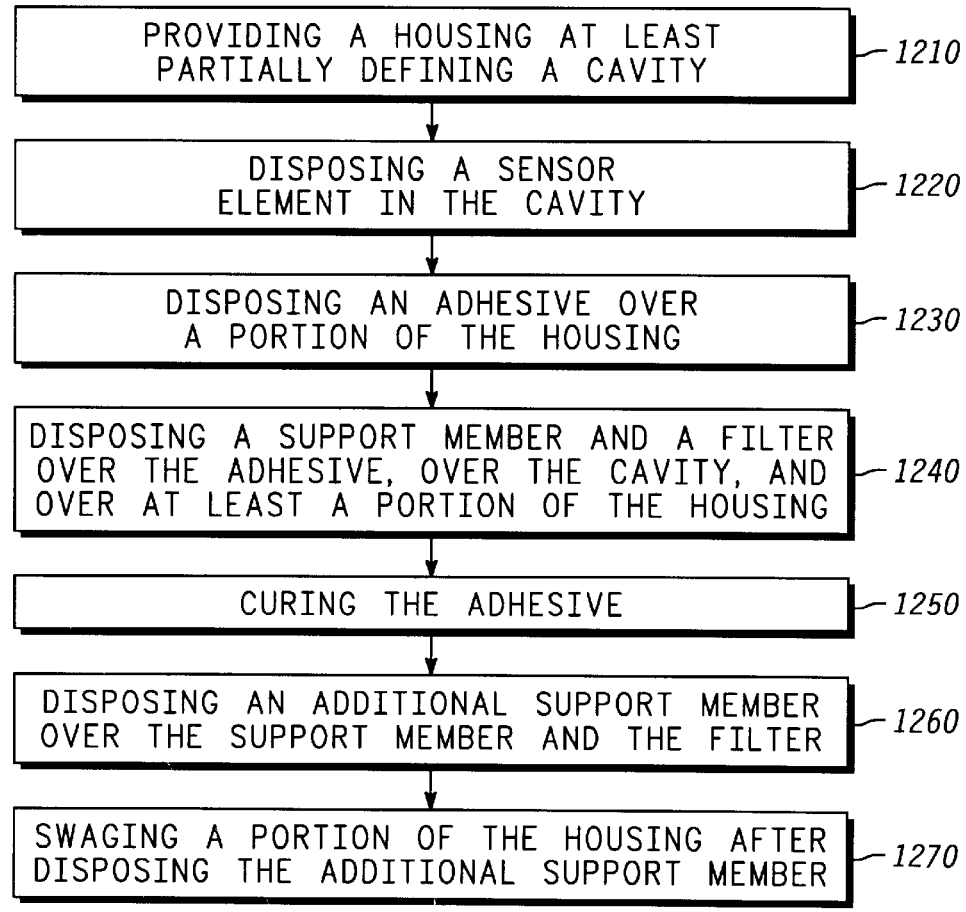
FIG. 12 illustrates a flow chart of a method of manufacturing a component in accordance with an embodiment of the invention.

FIG. 12 illustrates a flow chart 1200 of a method of manufacturing a component. As an example, the component of flow chart 1200 can be similar to components 100, 900, 1000, or 1100 in FIGS. 6, 9, 10, and 11, respectively. At a step 1210 of flow chart 1200 in FIG. 12, a housing at least partially defining a cavity is provided. Then, at a step 1220 of flow chart 1200, a sensor element is placed, positioned, or otherwise disposed in the cavity. Next, at a step 1230, an adhesive is placed, positioned, or otherwise disposed over a portion of the housing. As an example, the adhesive can be dispensed in a continues bead over a rim of the housing. The rim can be roughened or can receive surface activation (i.e., ultra-violet light) before disposing the adhesive over the housing.

Subsequently, at a step 1240 of flow chart 1200 in FIG. 12, a support member and a filter are placed, positioned, or otherwise disposed over the adhesive, over the cavity, and over at least a portion of the housing. The support member has a hole located over the cavity, and the filter is located over the support member and over the hole in the support member. Step 1240 can displace at least a portion of the adhesive. This displacement can increase the height of the adhesive. As an example, the displacement of the adhesive can be accomplished by using the support member to apply pressure to the adhesive when disposing the support member over the adhesive.

In one embodiment of step 1240, the filter can be provided to be attached or otherwise coupled to the support member, and then the support member and the filter can be simultaneously disposed over the adhesive, the cavity, and at least a potion of the housing. In a different embodiment of step 1240, the support member can be first disposed over the adhesive, and then, the filter can be disposed over the support member.

Next, at a step 1250 of flow chart 1200 in FIG. 12, the adhesive is cured. As an example, when the adhesive is comprised of Sifel 604, the curing process of step 1250 can be performed for approximately one hour at approximately 150 degrees Celsius. The adhesive is cured to preferably form a continuous seal between the support member and the housing.

Then, at a step 1260 of flow chart 1200, an additional support member is placed, positioned, or otherwise disposed over the filter and the support member. Preferably, step 1260 occurs after step 1250 to prevent excessive displacement of the adhesive. Subsequently, at a step 1270, a rim or other portion of the housing is swaged or otherwise deformed. Preferably step 1270 is performed after step 1260 to prevent excessive displacement of the adhesive. The swaging process of step 1270 mechanically couples the additional support member to the housing and preferably uses both elevated pressure and elevated temperature.

Figure 13:
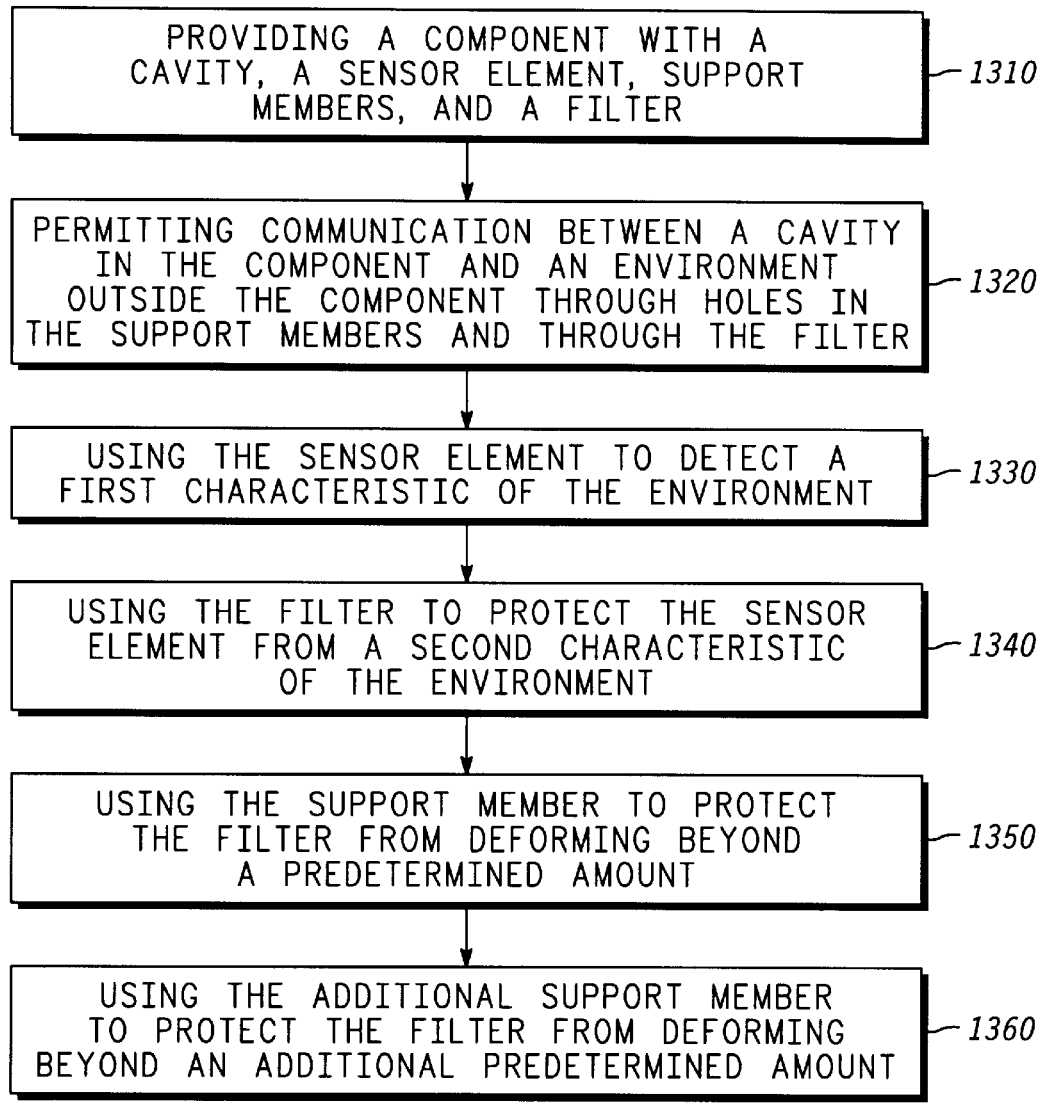
FIG. 13 illustrates a flow chart of a method of operating a component in accordance with an embodiment of the invention.

FIG. 13 illustrates a flow chart 1300 of a method of operating a component. As an example, the component can be similar to components 100, 900, 1000, or 1100 in FIGS. 6, 9, 10, and 11, respectively. At a step 1310 of flow chart 1300 in FIG. 13, a component is provided to comprise a housing at least partially defining a cavity, a sensor element in the cavity, a support member over the cavity and over at least a portion of the housing and having a hole over the cavity, a filter over the support member and over the hole in the support member, and an additional, but optional, support member over the filter and having an additional hole over the filter and the hole in the support member.

Then, at a step 1320 of flow chart 1300 in FIG. 13, communication is permitted between the cavity and an environment outside the cavity through the hole in the support member, through the filter, and through the additional hole in the additional support member. Next, at a step 1330, the sensor element is used to detect a first characteristic of the environment. As an example, the first characteristic of the environment can be a pressure of the environment.

Subsequently, at a step 1340 of flow chart 1300, the filter is used to protect the sensor element from a second characteristic of the environment. As an example, the filter can be used to prevent the second characteristic from entering the cavity in the housing. The second characteristic of the environment can be, for example, a corrosive element or media.

Next, at a step 1350 of flow chart 1300 in FIG. 13, the support member is used to protect the filter from deforming beyond a predetermined amount, and at a step 1360, the additional support member is used to protect the filter from deforming beyond an additional predetermined amount. As an example, the predetermined amount of step 1350 can be in a first direction, and the additional predetermined amount of step 1360 can be in a second direction different from the first direction. In the preferred embodiment, the first and second directions are opposite each other.

Therefore, an improved component is provided to overcome the disadvantages of the prior art. The components described herein provide effective corrosion protection while not adversely affecting the performance of the component. The location of the filter between two support members improves the robustness of the filter to prevent, or at least reduce, mechanical failures of the filter due to large and/or quick changes in pressure. The easy assembly methods for the component also minimize the manufacturing costs of the component.

Although the invention has been described with reference to specific embodiments, it will be understood by those skilled in the art that various changes may be made without departing from the spirit or scope of the invention. For instance, the numerous details set forth herein such as, for example, the material compositions, the dimensions, and the sequence of manufacturing and operating steps are provided to facilitate the understanding of the invention and are not provided to limit the scope of the invention. Additionally, a coating or encapsulant can be used inside the cavity in the housing, and the components can be devoid of electrical leads. Furthermore, the support members and/or filters can be permanently attached to each other and/or the housing. Alternatively, the support members and/or filters can be removable, interchangeable, and/or replaceable parts, but such replacement constitutes reconstructing or rebuilding the component and not repair of the component.

Moreover, steps 1320, 1330, 1340, 1350, and 1360 in flow chart 1300 of FIG. 13 or any subset thereof can be performed simultaneously with each other. Still furthermore, the two support members and the filter can be pre-assembled together, and this assembly can be disposed over the adhesive, over the cavity, and over at least a portion of the housing during step 1240 of flow chart 1200 in FIG. 12. In this embodiment of flow chart 1200, step 1260 is eliminated, and step 1270 is optional.

Accordingly, the disclosure of embodiments of the invention is intended to be illustrative of the scope of the invention and is not intended to be limiting. It is intended that the scope of the invention shall be limited only to the extent required by the appended claims.

Benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. As used herein, the term "comprise," "include," "have," and any variations thereof, are intended to cover a non-exclusive inclusion, such that a process, method, article, or apparatus that comprises a list of elements does not include only those elements, but may include other elements not expressly listed or inherent to such process, method, article, or apparatus.

What is claimed is:

1. A component comprising:
   a housing at least partially defining a cavity;
   a sensor element in the cavity;
   a support member over the cavity, over at least a portion of the housing, and having a hole over the cavity; and
   a filter over the support member and over the hole in the support member;
   wherein the housing further comprises a rim supporting the support member over the cavity;
   wherein the rim comprises:
      a surface; and
      a plurality of protrusions extending from the surface;
   wherein the plurality of protrusions support the support member over the surface of the rim.

2. The component of claim 1 further comprising:
   an adhesive adhering the support member to the rim, wherein:
      the adhesive forms a continuous seal between the support member and the housing.

3. The component of claim 1 wherein:
   the support member and the filter are located within the housing.

4. The component of claim 1 further comprising:
   an additional support member over the filter and having an additional hole over the filter and the hole in the support member.

5. The component of claim 4 wherein:
   a portion of the housing is over the additional support member.

6. The component of claim 4 wherein:
   the support member, the filter, and the additional support member are located within the housing.

7. The component of claim 1 further comprising:
   electrical leads in the cavity, extending through the housing, and protruding outside of the housing.

8. The component of claim 1 further comprising:
   an electronic element in the cavity and adjacent and electrically coupled to the sensor element.

9. A component comprising:
   a housing at least partially defining a cavity;
   a sensor element in the cavity;
   a support member over the cavity, over at least a portion of the housing, and having a hole over the cavity, wherein the housing further comprises a rim supporting the support member over the cavity;
   a filter over the support member and over the hole in the support member;
   an adhesive adhering the support member to the rim;
   wherein the adhesive forms a continuous seal between the support member and the housing;
   wherein the support member has a first side facing towards the cavity, a second side facing towards the filter, and an edge coupling together the first and second sides; and
   wherein the adhesive adheres the first side and the edge of the support member to the housing.

10. The component of claim 9, wherein:
    the edge has a height; and
    the adhesive has a height from the rim at least as high as the height of the edge.

11. The component of claim 9 wherein:
    the rim is continuous; and
    the adhesive is continuous over the rim.

12. A component comprising:
a housing at least partially defining a cavity;
a sensor element in the cavity;
a support member over the cavity, over at least a portion of the housing, and having a hole over the cavity, wherein the housing further comprises a rim supporting the support member over the cavity;
a filter over the support member and over the hole in the support member;
an adhesive adhering the support member to the rim;
wherein the adhesive forms a continuous seal between the support member and the housing;
wherein the rim comprises:
 a surface; and
 a plurality of protrusions extending from the surface;
wherein the support member has a first side facing towards the cavity, a second side facing towards the filter, and an edge coupling together the first and second sides;
wherein the plurality of protrusions support the first side of the support member over the surface of the rim;
wherein the adhesive is located at least between the surface of the rim and the first side of the support member; and
wherein the adhesive adheres the edge of the support member to the housing and adheres a perimeter of the first side of the support member to the rim.

13. A component having a cavity in communication with an environment outside the component, the component comprising:
a housing having a recess and a rim located at a perimeter of the recess, the cavity located within the recess;
a sensor element in the cavity;
a first support member in the recess, supported over the cavity by the rim, and having a first hole over the cavity;
a filter in the recess, supported over the cavity by the first support member, located over the first hole in the first support member; and
a second support member in the recess, supported over the cavity by the filter, and having a second hole over the filter, the first hole in the first support member, and the cavity;
wherein the rim comprises:
 a surface facing away from the cavity; and
 a plurality of protrusions extending from the surface away from the cavity;
wherein the plurality of protrusions support the first support member over the surface of the rim.

14. The component of claim 13 wherein:
the cavity is in communication with the environment through the first hole of the first support member, the filter, and the second hole of the second support member.

15. The component of claim 13 wherein:
the first and second support members are comprised of stainless steel.

16. The component of claim 13 wherein:
the filter is comprised of polytetrafluoroethylene.

17. The component of claim 13 further comprising:
an adhesive adhering the first support member to the rim to form a continuous seal between a perimeter of the first support member and the housing,
wherein:
 the rim is continuous around the perimeter of the recess; and
 the adhesive forms a continuous bead around the perimeter of the recess and over the rim.

18. The component of claim 13 wherein:
the first support member is chemically coupled to the housing;
the filter is chemically coupled to the first support member; and
the second support member is mechanically coupled to the housing.

19. A component having a cavity in communication with an environment outside the component, the component comprising:
a housing having a recess and a rim located at a perimeter of the recess, the cavity located within the recess;
a sensor element in the cavity;
a first support member in the recess, supported over the cavity by the rim, and having a first hole over the cavity;
a filter in the recess, supported over the cavity by the first support member, located over the first hole in the first support member;
a second support member in the recess, supported over the cavity by the filter, and having a second hole over the filter, the first hole in the first support member, and the cavity;
an adhesive adhering the first support member to the rim to form a continuous seal between a perimeter of the first support member and the housing;
wherein the rim is continuous around the perimeter of the recess;
wherein the adhesive forms a continuous bead around the perimeter of the recess and over the rim;
wherein the rim comprises:
 a surface facing away from the cavity; and
 a plurality of protrusions extending from the surface away from the cavity; and
wherein the first support member has a first side facing towards the cavity, a second side facing towards the filter, and an edge coupling together the first and second sides;
wherein the plurality of protrusions support the first side of the first support member over the surface of the rim; and
wherein the adhesive is located between the first side of the first support member and the surface of the rim and is located between the edge of the first support member and the housing.

20. The component of claim 19 wherein:
the adhesive adheres the edge of the first support member to the housing and the first side of the first support member to the rim.

21. The component of claim 19 wherein:
the edge has a height; and
the adhesive has a height from the rim at least as high as the height of the edge.

22. A component having a cavity in communication with an environment outside the component, the component comprising:
a housing having a recess and a rim located at a perimeter of the recess, the cavity located within the recess;
a sensor element in the cavity;

a first support member in the recess, supported over the cavity by the rim, and having a first hole over the cavity;

a filter in the recess, supported over the cavity by the first support member, located over the first hole in the first support member;

a second support member in the recess, supported over the cavity by the filter, and having a second hole over the filter, the first hole in the first support member, and the cavity;

electrical leads having a first portion protruding outside of the housing, a second portion extending through the housing, and a third portion in cavity and electrically coupled to the sensor element, wherein the housing further comprises:
an additional rim located at a perimeter of the cavity, located below the rim, and supporting the third portion of the electrical leads in the cavity; and
a mounting surface located below the additional rim and supporting the sensor element.

23. The component of claim 22 further comprising:
an electronic element in the cavity, adjacent and electrically coupled to the sensor element, and electrically coupled to the third portion of the electrical leads.

24. A component comprising:
a housing at least partially defining a cavity, the housing including a rim (120) having a surface;
a sensor element in the cavity;
a filter;
a support member including a portion located over the surface of the rim, at least a portion of the support member is located under the filter to provide support for the filter over the cavity, the at least a portion of the support member located under the filter defines a hole over the cavity;
a plurality of protrusions separating the surface of the rim and the portion of the support member located over the surface of the rim;
an adhesive located at least between the surface of the rim and the portion of the support member located over the surface of the rim.

25. The component of claim 24 wherein the adhesive forms a continuous seal between the support member and the housing.

26. The component of claim 24 wherein:
the rim is continuous; and
the adhesive is continuous over the rim.

27. A component comprising:
a housing at least partially defining a cavity, the housing including a rim having a surface;
a sensor element in the cavity;
a filter;
a support member including a portion located over the surface of the rim, at least a portion of the support member is located under the filter to provide support for the filter over the cavity, the at least a portion of the support member located under the filter defines a hole over the cavity;
a plurality of protrusions separating the surface of the rim and the portion of the support member located over the surface of the rim, the plurality of protrusions support the support member over the surface of the rim;
an adhesive located at least between the surface of the rim and the portion of the support member located over the surface of the rim.

28. The component of claims 27 wherein:
the protrusions ensure a thickness of the adhesive between the surface of the rim and die the portion of the support member over the surface of the rim.

29. The component of claim 27 wherein the adhesive forms a continuous seal between the support member and the housing.

30. The component of claim 27 wherein:
the rim is continuous; and
the adhesive is continuous over the rim.

* * * * *